(12) United States Patent
Brown et al.

(10) Patent No.: US 10,347,503 B2
(45) Date of Patent: Jul. 9, 2019

(54) METHOD AND HARDWARE FOR ENHANCED REMOVAL OF POST ETCH POLYMER AND HARDMASK REMOVAL

(71) Applicant: Tokyo Electron Limited, Minato-ku, Tokyo (JP)

(72) Inventors: Ian J. Brown, Austin, TX (US); Junjun Liu, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 513 days.

(21) Appl. No.: 14/537,702

(22) Filed: Nov. 10, 2014

(65) Prior Publication Data

US 2015/0128991 A1  May 14, 2015

Related U.S. Application Data

(60) Provisional application No. 61/902,485, filed on Nov. 11, 2013.

(51) Int. Cl.
  *H01L 21/311* (2006.01)
  *H01L 21/02* (2006.01)
  (Continued)

(52) U.S. Cl.
  CPC .. *H01L 21/31133* (2013.01); *H01L 21/02063* (2013.01); *H01L 21/31111* (2013.01);
  (Continued)

(58) Field of Classification Search
  CPC ......... H01L 21/31133; H01L 21/02063; H01L 21/31111; H01L 21/67115;
  (Continued)

(56) References Cited

U.S. PATENT DOCUMENTS 3,664,899 A   5/1972  Wright et al.
6,800,142 B1 * 10/2004 Tipton ..................... B08B 3/08
                                                    134/1
(Continued)

FOREIGN PATENT DOCUMENTS

TW   200405456 A   4/2004
TW   201324064 A1  6/2013
(Continued)

OTHER PUBLICATIONS

International Search Report and Written Opinion dated Jan. 28, 2015 in PCT/US 14/64862.

(Continued)

*Primary Examiner* — Alexander Markoff
(74) *Attorney, Agent, or Firm* — Oblon, McClelland, Maier & Neustadt, L.L.P.

(57) ABSTRACT

Methods for cleaning substrates are described including cleaning substrates having hardmask masks and polymer films, such part of semiconductor fabrication. Cleaning methods include ultraviolet (UV) light exposure of process gas mixtures and liquid cleaning chemistries. A substrate and/or process fluids are exposed to ultraviolet radiation. A process gas mixture being irradiated can include an oxidizing gas mixture (air, clean dry air, oxygen, peroxygen, etc.). Reducing gas mixtures, having hydrogen, can also be irradiated. Reactive species from irradiated gas mixtures are exposed to the substrate to chemically modify film properties, such as by facilitating a subsequent liquid cleaning step. Liquid cleaning chemistries on a substrate surface can also be irradiated. Such cleaning techniques enable shorter cleaning times, lower processing temperatures, and reduced damage to underlying or intermediate layers such as dielectric layers.

20 Claims, 3 Drawing Sheets

(51) Int. Cl.
*H01L 21/3213* (2006.01)
*H01L 21/67* (2006.01)

(52) U.S. Cl.
CPC .. *H01L 21/32134* (2013.01); *H01L 21/67051* (2013.01); *H01L 21/67115* (2013.01); *H01L 21/31144* (2013.01)

(58) Field of Classification Search
CPC ......... H01L 21/32134; H01L 21/67051; H01L 21/31144
See application file for complete search history.

(56) References Cited

U.S. PATENT DOCUMENTS

| | | | |
|---|---|---|---|
| 7,265,061 | B1 | 9/2007 | Cho et al. |
| 2004/0131980 | A1 | 7/2004 | Hayasaki et al. |
| 2008/0092918 | A1 | 4/2008 | Ikuta |
| 2008/0267815 | A1 | 10/2008 | Morishima et al. |
| 2011/0132394 | A1* | 6/2011 | Rastegar ............ B08B 3/10 134/1 |
| 2013/0200040 | A1* | 8/2013 | Fitzsimmons .... H01L 21/02063 216/17 |

FOREIGN PATENT DOCUMENTS

| | | |
|---|---|---|
| WO | WO 2011/072188 A2 | 6/2011 |
| WO | WO 2013/018569 A1 | 2/2013 |

OTHER PUBLICATIONS

Office Action dated Sep. 30, 2016 in Taiwanese Patent Application No. 103138949 (with English language translation).
Combined Taiwanese Office Action and Search Report dated Dec. 28, 2015 in Patent Application No. 103138949 (with English language translation).
Office Action dated Apr. 26, 2018, in Korean Patent Application No. 10-2016-7015575 (with English-language translation).
Office Action dated Jun. 20, 2017, in KR Application Serial No. 10-2016-7015575, filed Jun. 10, 2016 (with English translation).
Cited references in Office Action previously cited.

* cited by examiner

METHOD AND HARDWARE FOR ENHANCED REMOVAL OF POST ETCH POLYMER AND HARDMASK REMOVAL

CROSS REFERENCE TO RELATED APPLICATIONS

The present application claims the benefit of U.S. Provisional Patent Application No. 61/902,485, filed on Nov. 11, 2013, entitled "Method and Hardware for Enhanced Removal of Post Etch Polymer and Hardmask Removal," which is incorporated herein by reference in its entirety.

BACKGROUND OF THE INVENTION

The present application relates generally to semiconductor processing and relates particularly to a substrate cleaning processes.

Fabrication of integrated circuits and semiconductor devices can involve many different types of processing techniques. Such techniques generally involve patterning a substrate and using the pattern to make various sacrificial and/or permanent structures. For example, photolithography can be used to create patterned layers using a thin layer of radiation-sensitive material, such as photoresist. This radiation-sensitive layer is transformed into a patterned mask that can be used to etch or transfer a pattern into an underlying layer on a substrate. Thus the patterned layer of photoresist can act as a mask for directional (anisotropic) etching of one or more underlying layers. To overcome challenges in photolithography image transfer, a patterned photoresist (functioning as a mask), can be used to create another mask in an underlying material with significantly different etch selectivity, this material is commonly referred to as a hardmask. Creating a hardmask can be beneficial because a given target underlying layer to be etched can respond to an etch chemistry that might simultaneously etch photoresist material, which would render a given photoresist relief pattern essentially ineffective to be used as a mask for some materials to be etched. Fabrication of integrated circuits and semiconductor devices can be a cyclical process of depositing materials, modifying materials, patterning materials, and removing materials. It is common to have a need to remove one type of material (such as a hardmask) without removing a second type of material, such as a patterned underlying layer. Various cleaning processes can be implemented to selectively remove or clean materials off of a given substrate. Such cleaning processes can include both wet cleaning techniques (such as reactive liquid chemicals) and dry cleaning techniques (such as plasma-based cleaning) using particular chemistries and/or physical mechanisms to clean materials off of a substrate.

SUMMARY

Certain substrate cleaning applications involve removing polymer material and a hardmask from a substrate without damaging an underlying low-k dielectric film. Thus, a hardmask that has been used as an etch mask to etch a low-k dielectric film typically needs to be selectively removed to continue with fabrication processes. Such low dielectric films can have a dielectric constant less than about 2.6 and/or have a chemical composition of silicon, carbon, oxygen and hydrogen. Such dielectric films can be porous and susceptible to damage. Polymer materials can include fluorinated polymers among others. Hardmasks can include titanium nitride (TiN) as well as other hard masks or similar materials such as amorphous carbon, TaN, and SiC. Techniques herein are applicable for removal of essentially any conventional, sacrificial hardmask including non-oxide based hardmasks, metal hardmasks, and some oxide hardmasks. This hardmask layer can be used to improve etching processes into softer low-k dielectrics. In example embodiments, a hardmask layer composition can be comprised of a material $Si_xM_{(1-x)}N_yO_zB_w$, wherein M represents either individually or a combination of Ti, W, Ta, Ge, C and x is less than 1 including zero. A given hardmask film can be crystalline or amorphous.

Pattern transfer into silicon, silicon dioxide and low-k dielectric substrates is typically performed using plasma etching tools. Typical etch chemistry used can include hydrofluorocarbons such as $CF_4$, $C_4F_8$, $CH_2F_2$, $C_2F_4$, $C_3F_6$, etc. In the plasma tool environment above the wafer, the hydrofluorocarbons produce polymerizing radicals and ions which result in polymer deposition onto a substrate being processed. The amount of polymer deposition can be controlled via plasma process conditions and/or by adding or removing an oxidizing species such as oxygen into the plasma chamber. The deposited polymer has various functions.

A given etch process is a balance of deposition, diffusion, chemisorption, surface and gas phase reactions between reactant species and the substrate. Polymer thickness can also be controlled by changing the plasma tool process parameter such as bias voltage, gas composition, pressure etc. By way of an example substrate composition of $Si/SiO_2$, there are various surface kinetics in play during etching of such a substrate. Fluorocarbon etching of $SiO_2$ relies on polymerization and chemically enhanced sputtering. $C_xF_y$ passivation can regulate delivery of precursors and activation energy. Chemisorption of $CF_x$ can produce a complex at the oxide-polymer interface (oxide underneath a polymer top layer). Etch precursors and products can diffuse through the polymer layer. In some substrate stacks this diffusion can consume the polymer. In silicon etching, however, $CF_x$ may not be consumed, resulting in thicker polymer layers.

To meet the demands of scaling, etch processes are being developed that deposit polymers that are highly fluorinated and/or cross-linked. Such cross linking and fluorination can be specified or needed to meet performance requirements of a given etch process, which can include metrics such as profile, etch rate, etch selectivity, and etch uniformity.

In fabrication facilities around the world, integrated circuit makers are increasingly finding post-etch polymers that are difficult to remove or that cannot be removed with conventional chemicals or ash processes without damaging the sensitive low-k dielectric layer below. Techniques herein provide methods for removing these highly cross-linked, branched and fluorinated polymers. Such cleaning can include a gas-based and wet clean process.

An additional challenge for post-etch cleans is a further requirement to remove the hardmask used in the corresponding etch process that contributes to polymer deposition. It is desirable to remove hardmasks during a wet clean to reduce the aspect ratio of the trenches and reduce a risk of pattern collapse during the drying process, which can also eliminate a need for hardmask removal in a chemical-mechanical polishing (CMP) step after a copper fill step. CMP processes are more expensive than wet clean processes and are also more abrasive which can damage structures.

Systems and methods herein include an ultraviolet (UV) light exposure in a wet spin chamber that can operate under atmospheric pressure. The performance of conventional wet chemicals used in fabrication can be enhanced by customized selection of an electromagnetic radiation source. Techniques herein reduce thermal budgets and/or process times by increasing or expanding the reactivity of the vapor or liquid chemistry used in a cleaning process. Processes include sequential removal of a polymer film followed by removal of a metal hard mask. Alternative processes include simultaneous removal of polymer film and metal hard mask.

One embodiment includes a method for cleaning a substrate. The method includes receiving a substrate in a cleaning system. The cleaning system includes a wet clean system, a processing chamber, and a fluid delivery sub system. The substrate includes a hardmask layer deposited on an underlying layer, and a polymer film at least partially covering the hardmask layer. A process gas mixture is irradiated with ultraviolet radiation such that reactive oxygen species are formed. The substrate is exposed to the process gas mixture having reactive oxygen species such that the reactive oxygen species chemically modify the polymer film. Further steps include spinning the substrate on a substrate holder in the processing chamber, and depositing a hydrogen peroxide-containing liquid mixture on the substrate while the substrate is spinning.

Accordingly, the polymer film and hardmask layer can both be cleaned from the substrate. Techniques herein have been demonstrated to increase the strip rate of a TiN hardmask film by 100% as compared to conventional techniques of stripping TiN hardmasks. Conventionally, hardmasks are removed from low-k films using a wet etching process in which a solution containing hydrogen peroxide (H2O2) is dispensed on a spinning wafer at an elevated temperature. The H2O2 reacts with the hardmask to dissolve the hardmask, leaving underlying films and structures on the substrate. The drawback of such a cleaning process is that conventionally this process treats a single wafer at a time, and cleaning a given TiN hardmask from a wafer (such as a 300 mm diameter) can take about 6 minutes. Such a relatively long treatment time reduces throughput and efficiency. Thus, the improvements herein are advantageous in improving productivity of the post etch cleaning tool, by reducing a treatment temperature of TiN strip chemistry, reducing an amount of chemistry used, and extending lifetime of a strip tool and chemistry, and enabling the polymer films to be removed including such polymer films that would otherwise not be removable using conventional wet cleaning chemistry.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include methods for using an ultraviolet (UV) light exposure wet spin chamber that can operate under atmospheric pressure. At least two process modes can be selected for use. In a first process mode, a substrate is exposed to electromagnetic radiation. The substrate is dry with no liquid on the surface of the substrate. The substrate can be stationary or spinning. The atmosphere can be of several options. The atmosphere can be oxidizing (air, clean dry air, oxygen, low oxygen atmosphere (greater than 0.1 ppm but less than 21%) or peroxide vapor, peracetic acid vapor, acetic acid vapor or other volatile peroxygen compound. The atmosphere can be a reducing environment (hydrogen-containing atmosphere below the lower explosive limit, ammonia environment below the lower explosive limit. The atmosphere can be a combination of oxidizer and reducing gases. Alternatively, the atmosphere can be inert gas ambient. For safety the concentration of each component should be below the lower explosive limit for each respective component. The atmosphere can be an inert atmosphere with the heating of the substrate to temperatures between 25 degrees Celsius to 400 degrees Celsius—preferably less than 350 degrees Celsius, and more preferably less than 200 degrees Celsius.

In a second process mode option, a substrate is exposed to electromagnetic radiation while the substrate is wetted by a liquid that is photosensitive to one or more wavelengths of electromagnetic radiation being used. For example, hydrogen peroxide solutions can be split into two hydroxyl radicals by light with a wavelength of less than 850 nm but practically less than 420 nm and preferentially equal to or less than about 254 nm. Solutions of other peroxygen solutions such as acetic acid, maleic acid, methyl ethanoate, performic acid, and peroxyacetic acid can be used as well. Dilute ammonia, ammonium ions (from an ammonium hydroxide solution) or solution of other primary, secondary or tertiary amines can be split into hydrogen and NHx species and nitrogen as shown in the diagram below. Wavelengths above 190 nm are preferable to prevent damage to any exposed low-k dielectric. Processes described herein have at least three benefits: (i) providing an alternative reaction mechanism to reduce any organic polymer material instead of oxidation, (ii) preventing corrosion of exposed metals and/or reducing metal oxides back to metal with generation of hydrogen, and (iii) improving performance of de-ionized water/NHx containing rinse solution to prevent copper (Cu) corrosion by removing residual oxygen at the liquid/substrate surface and reducing any copper oxide (CuOx) formed back to Cu metal.

Figure 1:
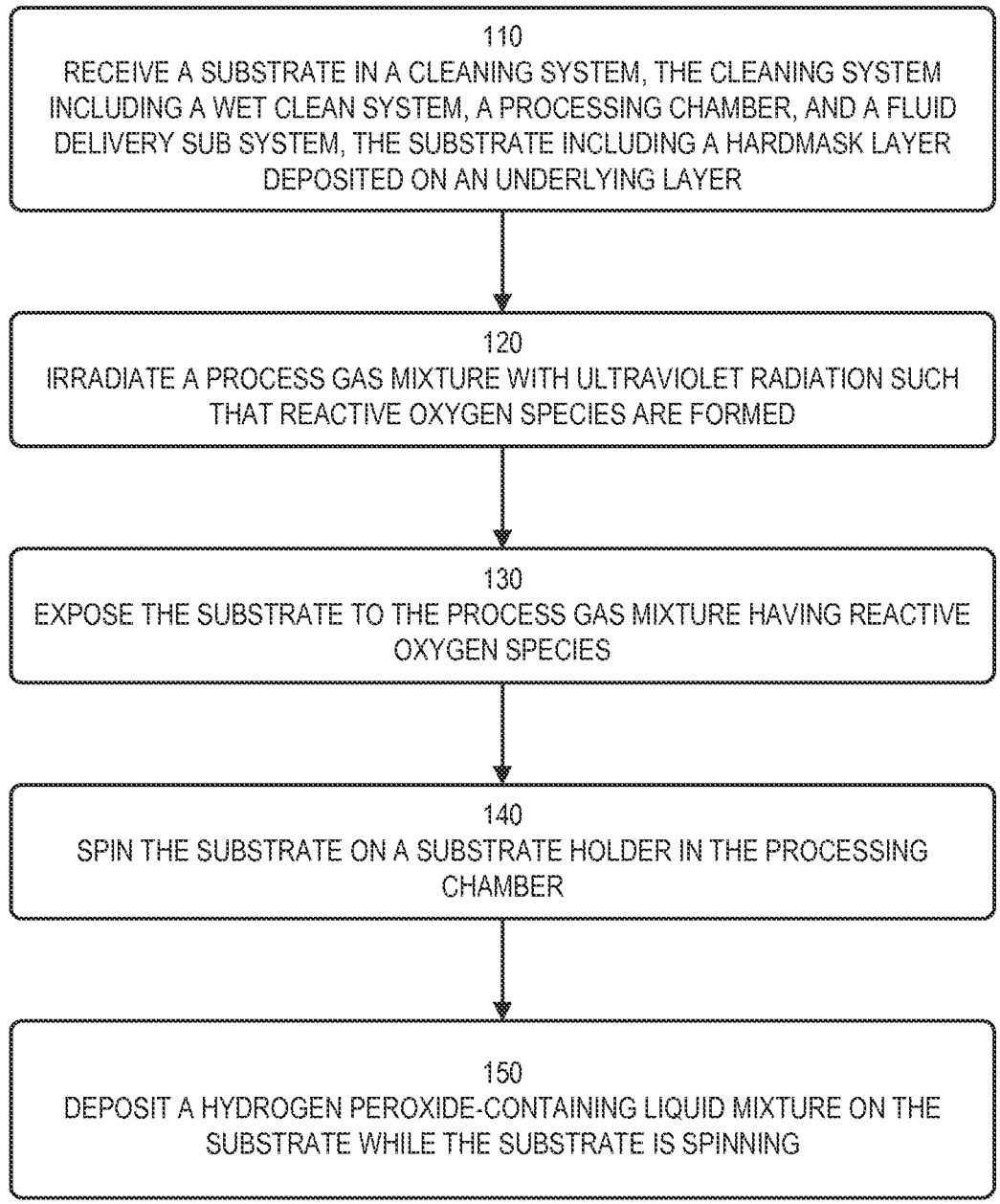
FIG. 1 is a flow chart of an example process according to embodiments herein.

Referring now to FIG. 1, a flow chart of an example process flow for cleaning a substrate is shown. In step 110, a substrate 205 is received in a cleaning system 200, such as that shown in FIGS. 2-3. The substrate 205 can include semiconductors, flat panels, wafers, etc. The cleaning system 200 includes a wet clean system 210, a processing chamber 220, and a fluid delivery subsystem. The fluid delivery subsystem can include a process gas conduit 223 configured to direct a process gas towards/across substrate 205. Note that various vapor delivery options are available, and alternative configurations can, for example, flow process gas mixtures toward the substrate from a point vertically above a substrate. The wet clean system 210 can include a nozzle 211 for dispensing liquid chemistry onto a surface of substrate 205. The nozzle 211 can be connected to a fluid delivery subsystem via feed pipe 212. A nozzle arm 213 can be mounted on a vertical support member 215 that can be horizontally moveable on a guide rail 214, or rotationally movable. The substrate 205 can be received in the cleaning system 200 via delivery member (not shown) which can place substrate 205 on substrate holder 202. Substrate holder 202 can include drive motor 203 configure to rotate substrate holder 202 at a given rotational velocity.

The cleaning system can include UV light source 250 configured to irradiate UV light towards substrate 205. The UV light source 250 can be configured to irradiate a process gas mixture, a dispensed fluid, and/or substrate 205. Various UV light sources are conventionally available and can be selected for use with methods herein. UV light sources can be narrow spectrum sources or broad range sources used with filters as needed. For example, if a given underlying material is a low-k dielectric, then it is beneficial to have a UV filter that allows transmission of wavelengths above 230 nm. In other words, methods can include filtering out UV radiation below 230 nanometers. In another example, a broadband UV source (160 nm-1100 nm wavelength) can have specific filters to block illumination below and/or above a specific wavelength, or to permit only specific wavelengths to pass through. By way of a non-limiting example, treatments can include irradiating with UV electromagnetic radiation having an intensity greater than approximately 4 mW/cm2 or greater than 800 mW/cm2 with the UV source positioned at about 5 cm from a substrate surface. A dosage amount can depend on a particular application or cleaning process. In other embodiments, the UV intensity per unit area is sufficient to increase a hardmask strip rate by more than approximately 25% as compared to a strip rate of the hardmask without irradiation.

Figure 2:
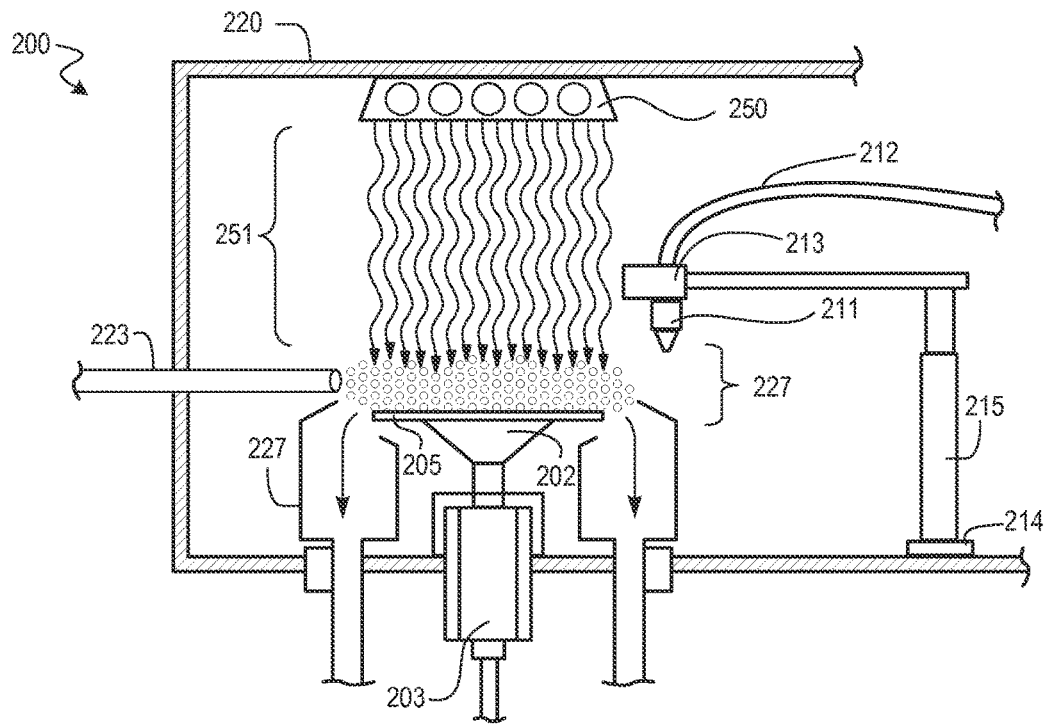
FIG. 2 is a cross-sectional schematic view of an example cleaning system according to embodiments herein showing process gas UV irradiation.
Figure 3:
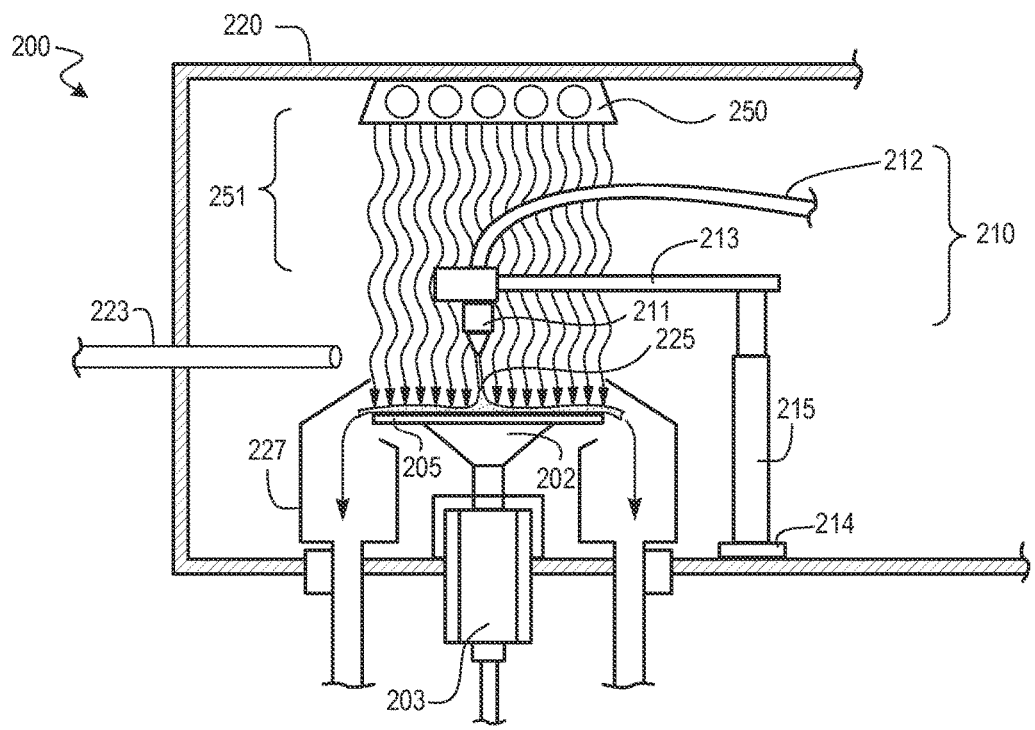
FIG. 3 is a cross-sectional schematic view of an example cleaning system according to embodiments herein showing dispensed liquid UV irradiation.
Figure 4:
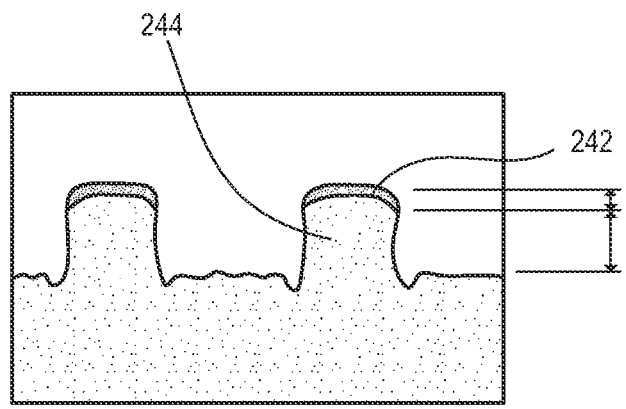
FIG. 4 is a cross-sectional illustration of a substrate segment having a hardmask on patterned features according to embodiments herein.
Figure 5:
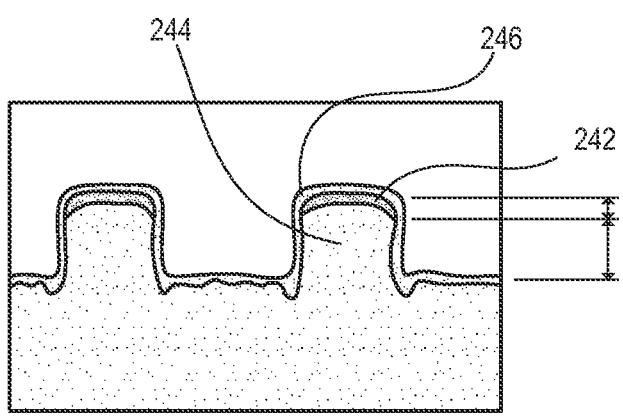
FIG. 5 is a cross-sectional illustration of a substrate segment having a hardmask and polymer coating on patterned features according to embodiments herein.

An optional gas diffusion plate (not shown) can be positioned between the UV light source 250 and the substrate holder 202. Such a gas diffusion plate can protect UV hardware from wet chemistry exposure, especially when the UV hardware is in close proximity to the substrate 105. Note that FIG. 2 shows UV light source 250 at a significant distance from substrate holder 203, which is for convenience in schematically diagramming cleaning system 200. In actual embodiments, UV hardware can be positioned a few centimeters from a given substrate surface, and thus could benefit from a gas diffusion plate or similar mechanism. The gas diffusion plate can be constructed of UV-transparent material or material that absorbs particular wavelengths based on a particular wavelength or wavelength range desired for use. A system controller (not shown) can be coupled to the substrate cleaning system and configured to control rotation speed of the substrate, UV irradiation, and treatment liquid delivery The substrate can include a hardmask 242 deposited on an underlying layer 244 as illustrated in FIG. 4. FIG. 4 is a cross-sectional illustration of an example substrate segment. Note that the hardmask 242 can be used to transfer a mask pattern into the underlying layer 244. Example substrates can have ultra low-k features with a TiN hardmask—or other hardmask 242—on top of the low-k features. It is this metal hardmask that a particular cleaning process can be specified to remove. An objective or specification of the cleaning process can be to leave the underlying material undamaged, such as low-k dielectric material. The hardmask layer 242 can be a layer or film that has a greater density as compared to the low-k material. This hardmask layer 242 can be used to improve etching processes into softer low-k dielectrics. In example embodiments, a hardmask layer composition can be comprised of a material $Si_xM_{(1-x)}N_yO_zB_w$, wherein M represents either individually or a combination of Ti, W, Ta, Ge, C and x is less than 1 including zero. A given hardmask film can be in a crystalline or amorphous state. The hardmask can include a metal hardmask layer using one or more of titanium nitride (TiN), tantalum nitride (TaN), silicon carbide (SiC), and amorphous carbon. The substrate can also have polymer material as polymer film 246, as shown in FIG. 5, covering the hardmask layer 242 and/or underlying layer 244. Polymer film 246 can include post-etch polymer residue and polymer materials that are difficult to remove with conventional wet cleaning chemistry.

In step 120, a process gas mixture is irradiated with ultraviolet radiation such that reactive oxygen species are formed. Referring to FIG. 2, process gas mixture 227 is shown flowing from process gas conduit 223 towards and/or across substrate 205. During such flow of process gas mixture 227, UV light 251 is irradiating the process gas mixture 227 thereby creating reactive oxygen species. In step 130, the substrate 205 is exposed to the process gas mixture having reactive oxygen species, such as by flowing reactive oxygen species to contact a top surface of the substrate 205.

Conventional oxidative ash processes can chemically modify and assist removal of post etch polymer, but can damage the underlying low k dielectric and oxidize exposed metal surface. In a given conventional patterning process, a reactive ion etch is executed to transfer a relief pattern. Perfluorinated etch chemistry (e.g. CH4, CF4, CH2F2, etc.) is included to provide passivation/protection during etch transfer. Next, conventionally, a reducing or weakly oxidative ash step (N2/H2, NH3, CO, CO2, etc.) is executed using a remote plasma source to minimize damage. Finally, a post-etch wet clean step is executed, such as by using diluted hydrofluoric acid, organic solvent, and or proprietary solvent mixture. A risk of using such conventional processes is that of initiating additional growth of the metal oxide layer. Another challenge with this process are that increasing cross-linked and highly fluorinated post etch polymers are deposited during the etching process to protect the low-k dielectric from plasma and chemical damage and for profile control (e.g. prevent bowing, taped profile).

In an alternative embodiment, the process gas mixture contains a reducing gas. Methods then include irradiating a reducing gas such that reactive reducing species are formed. The substrate is then exposed to the process gas mixture having reactive reducing species. Other embodiments can include mixtures of oxidizing gases and reducing gases, as well as alternating flow of oxidizing gases and reducing gases. In one embodiment, an oxidizing gas is irradiated and exposed to the substrate, followed by irradiating a reducing gas and exposing the reducing gas to the substrate. This sequence can help prevent or remove copper corrosion resulting from the reactive oxygen species prior to executing a wet clean step.

Methods herein, however, enable selective chemical modification of the post-etch polymer and reduce any exposed metal oxide back to metal without any significant damage or material loss of other material (e.g., other material can include a porous low-k dielectric with k-value less than 2.6). This chemical modification can also be valuable in a via open process in which vias, linking to underlying metal wires are opened. In this particular application, an underlying metal surface is exposed and polymer has to be removed without damaging the low-k dielectric or oxidizing further the exposed Cu/CuOx.

In one embodiment, after a reactive ion etch using perfluorinated etch chemistry, an oxidizing atmosphere and/or process gas mixture is irradiated with UV radiation, such as 180-400 nanometer UV light. The process gas mixture can include oxygen, air, or clean dry air. The processing chamber can be at vacuum or atmospheric pressure. Following this gas treatment, a reducing atmosphere can be irradiated similarly. This reducing gas can include a forming gas, and/or nitrogen with up to around 25% hydrogen. Note that a sequence of the oxidizing atmosphere and the reducing atmosphere can be switched. In some embodiments, an oxidizing process gas mixture can be cycled (alternated) with flowing of a reducing process gas mixture, with each gas mixture being irradiated. In other embodiments, the oxidizing process gas mixture can be combined with the reducing process gas mixture. The exposure or exposures to irradiated process gas mixtures can then be followed by a wet clean.

A forming gas can be used to remove oxides at temperatures in excess of 350 C, which is at or close to typical thermal budgets for BEOL manufacturing processes. By irradiating samples with UV light in a reducing atmosphere, a thermal budget can be reduced significantly. By way of a specific example, using wavelengths around 185 nm and/or 254 nm can improve thermal budgets for particular substrates. For example, such a temperature reduction can include a reduction to about room temperature. The order of process gas mixtures can be optionally switched, for example, depending on the extent of Cu residue sputtered at a via bottom during a via open process. Depending on the chemistry of a given post UV clean, it can be beneficial for sputtered Cu residues to be in a CuO or Cu2O form (Cu(I) or Cu(II) oxide).

One alternative embodiment uses only a UV irradiated reducing process gas mixture to chemically modify post-etch polymer residue. Such chemical modification can include fluorine removal, reduction of ketones to alcohols, aldehydes, reduction of esters and carboxylic acids to primary alcohols. Subsequently, a wet clean or UV irradiated wet clean can be executed. Such an embodiment can function as a replacement for a reducing plasma ash process. With this technique herein, the polymer film 246 is chemically and physically modified without damaging the underlying layer 244. Another alternative embodiment includes exposing a substrate to 185/254 nm UV light in a hydrogen/oxygen/inert atmosphere where hydrogen concentration is below the lower explosive limit (LEL). The inert gas can be selected as nitrogen, argon, helium, etc.

With various embodiments herein, the reducing atmosphere can be at atmospheric pressure. For practical reasons and safety reasons, the reducing atmosphere can have a hydrogen atmosphere below the flammability limit for the diluent gas. For example, mixtures of hydrogen and nitrogen do not pose a flammability risk if the hydrogen content is less than 5.5%. Hydrogen mixtures below about 5% will not burn in open air if the diluent is inert.

Thus, instead of replacing a wet clean process, a given polymer film can be selectively modified to improve performance of a subsequent wet clean. By irradiating the process gas mixture, reactive species can be formed, which can include, for example, ozone and singlet oxygen.

Using techniques herein enables damage-free removal of films that conventionally cannot be removed or that conventionally cannot be removed without damage to the underlying substrate. Another advantage is that techniques herein reduce an amount of chemistry and/or the cleaning process time to remove the polymer film as compared to conventional techniques. Another advantage of such techniques is reducing the thermal budget of the polymer and metal oxide reducing process. This temperature reduction provides organic residue modification with metal oxide reduction to enable high performance wet cleaning using just one UV source (e.g. 185/254 nm). A high performance wet clean can include complete organic residue/film removal, low (less than 2 nm) to zero metal loss of metallization metal (e.g. Cu), simple benign chemistry, and short process time for either batch or single wafer processes.

Methods herein can also assist in selectively reducing copper oxides prior to—or after—a wet clean treatment. UV irradiation can be executed on a wet cleaning platform either in a wet spinner chamber or in a dedicated UV substrate irradiation chamber. Rinse chemistry can contain dissolved ammonia or ammonium ions or other primary, secondary or tertiary amine that can be split using UV radiation. Conventional teachings suggest using 172 nm vacuum UV light to reduce copper oxides, but such teachings are problematic because films are often cured and cross-linked using 172 nm radiation. Methods herein, however, can modify the polymer and reduce the Cu oxides to Cu metal as a beneficial new process. This can be coupled with a wet clean to remove the bulk of given organic residue. Conventional teachings also suggest use of 254 nm light, but with a process time of up to about 10 hours. Such a long processing time is not practical in high-volume fabrication of semiconductor devices. Discoveries herein include using a dual wavelength source UV light for irradiation. For example, a low-pressure Hg bulb can reduce conventional processing time.

One example application includes copper via cleaning during back-end-of-line fabrication. In such an application, there are copper lines within a first dielectric layer or porous dielectric layer. A second dielectric layer is deposited on the first dielectric layer, and a hardmask on the second dielectric layer is patterned to etch through the second dielectric layer to uncover copper lines or points at specific locations on the substrate. During this etch process to uncover copper surfaces in the first dielectric layer, various copper oxide species can form on a surface of the copper. It is desired to remove these oxides with no Cu metal loss, and to also remove post-etch polymer on dielectric sidewalls with no dielectric loss.

Thus, techniques herein can include multiple alternative methods for removing polymer and hardmask films. In one embodiment, a substrate having a polymer residue film and hardmask with low-k layer is exposed to UV treated air as described previously. The air can include some oxygen or water vapor. The UV irradiation creates ozone and/or singlet oxygen. These reactive constituents then react with the polymer film and can change the contact angle of the polymer. With the contact angle changed, a wet cleaning process (using conventional polymer removal chemistry) can be used to remove the polymer.

In step 140, substrate 205 is spun on substrate holder 202 in processing chamber 220. In step 150, a hydrogen peroxide-containing liquid mixture is deposited on the substrate while the substrate is spinning. This wet cleaning step, coupled with the UV irradiated process gas exposure, provides an effective cleaning technique to remove polymer and hardmask materials without damage to dielectric layers.

Alternatively, the wet cleaning process can include UV irradiation to enhance hardmask removal by reducing a removal time and/or reducing a process temperature. In another alternative embodiment, a first UV-treated air exposure is executed, and then this reactive air exposure is followed by simultaneous removal of the polymer residue and hardmask. Simultaneous removal can be executed by using a hydrogen peroxide solution that includes a polymer solvent—this compound solution or mixture is irradiated with UV radiation to accelerate hardmask removal and simultaneously dissolve polymer film residue. Additional steps can follow such as a functional clean and rinse, reducing copper oxide to copper, etc.

Techniques herein include systems and methods for cleaning a substrate. Methods include a combined treatment of hydrogen peroxide and ultraviolet (UV) irradiation. Specific embodiments include the direct irradiation with 185/254 nm light from a low pressure mercury UV lamp of a spinning substrate immersed under a liquid film of dilute hydrogen peroxide solution. In one example result, irradiating a hydrogen peroxide solution of 20% hydrogen peroxide by weight with about 185/254 nm wavelength UV light having a light intensity of 12 mW/cm2 using 254 nm wavelength UV light results in about a 100% improvement of TiN strip rate as compared to processing with the same hydrogen peroxide solution without UV irradiation.

Techniques herein can increase TiN removal at room temperature by 25%-100% or more. An increased removal rate also occurs at higher temperatures and also with hydrogen peroxide mixed with other cleaning components. Conventional chemical suppliers sell one-step back-end-of-line (BEOL) cleaning chemistry that must be mixed with hydrogen peroxide to enable post etch polymer removal and titanium nitride hardmask removal. Such conventional BEOL cleaning chemistry can be used with techniques herein. There are several alternative embodiments of the enhanced removal techniques here. For example, a two-step process can also be used. In this alternative process, a polymer removal step is executed first, followed by a second step applying a dilute hydrogen peroxide-containing solution to a given substrate.

When executing a conventional cleaning process (conventional spin-on chemistry), after about 10 minutes of cleaning (spinning on a substrate holder while solution is being dispensed on the surface) 50% of the TiN hardmask is removed—this is using a 20% H2O2 solution at 25 degrees Celsius. With techniques herein, however, dispensing a 20% H2O2 solution, a wafer spin speed can be controlled so that a film solution of less than 2000 microns results on the surface of the substrate. With this relatively thin film covering the substrate, the hydrogen peroxide solution is irradiated with the UV electromagnetic radiation having a wavelength between approximately 185-500 nanometers. The temperature of the cleaning process and/or solution can be maintained at about 25 degrees Celsius. This treatment process results in TiN hardmask removal of about 97%.

In other embodiments, hydrogen peroxide solutions from 1% weight to 35% weight can be used with temperatures ranging from 0° C. to 80° C. In some embodiments, performance can be optimized by creating a thinnest continuous liquid film on the wafer. In some embodiments the liquid film is less than 2000 microns, while in other embodiments the thickness is less than 200 microns or even 20 microns. Controlling both a dispensing system and rotation speed can be used to achieve a desired film thickness. Thus, the solution is being continuously dispensed and irradiated during a treatment period. It is important to ensure continuous wetting of the substrate to prevent oxygen incorporation into the TiN film and formation of insoluble titanium oxide (TiO2). Oxidation of TiN in hydrogen peroxide solutions converts TiN to soluble [Ti(O2)(OH)n] species. Note that many substrates have a hydrophobic surface, and thus spinning is useful to maintain a continuous film. Spinning can also be used on hydrophilic substrates.

Solutions compatible with techniques herein can have a hydrogen peroxide portion less than 35% by weight (safety issues can arise with higher percentage weights). Conventional solutions can operate around 5% by weight. With techniques herein, a higher weight percentage of hydrogen peroxide can improve etch rate. In some embodiments, a hydrogen peroxide weight percentage can be 15% to 25%. The hydrogen peroxide solution 225 can be dispensed with a steady flow or by pulsing the solution. Although the solution can be dispensed by pulsing, the pulsing dispenses sufficient solution such that the substrate is continuously covered with the hydrogen peroxide solution. In other words, the pulsing is sufficient to ensure that the substrate is continually wetted during the pulsed dispense. Dry spots should be avoided because periodic drying of the substrate can cause a rise of particles, defects and pattern collapse. Another reason to avoid dry spots is to avoid a risk of TiN hardmask being oxidized by direct UV radiation to insoluble TiO2.

Dispensing the hydrogen peroxide solution 225 can include mixing a corrosion prevention mixture with the hydrogen peroxide solution. Such a solution can prevent corrosion of copper and keep metal species in solution. A solution can also contain one or more chelating agents (to extend bath life) targeted toward a particular metal film being removed. The solution can also include a pH buffer for either acidic or basic solutions. Other alternative embodiments can include a solvent to assist with polymer residue removal, and also a metal chelating agent.

Mixtures of sulfuric acid and hydrogen peroxide (SPM) using wavelengths of light to target photolysis of hydrogen peroxide and decomposition of Caro's acid (H2SO5) can be used to generate bisulfate (HSO4) and hydroxyl (OH) radicals .HSO4 and .OH respectively. Success of liquid phase electromagnetic radiation activated processes is increased by ensuring a thin liquid film on the wafer to ensure that any short-lived species (e.g. hydroxyl radical has a lifetime of 2 microseconds) react with the substrate and not with other constituents in the liquid film.

In surface preparation processes it is common to use sequential processing to adequately process the substrate. For example: (1) bulk material strip (organic or inorganic films) using sulfuric peroxide mix, phosphoric acid, sulfuric ozone mix, (2) organic residue removal (SC1(NH4OH: H2O2:DIW), SPM, DIW (de-ionized water)/Ozone) (3) metallic contamination using SC2(HCL:H2O2:DIW), dilute hydrochloric acid) (4) surface passivation (DIW/ozone or SC1 for OH termination of Si or dilute HF for H termination of Si) (5) rinsing (DIW, DIW/CO2 to prevent charging defects, DIW/NH3 or DIW/NH4OH to prevent charging defects and metal corrosion).

Techniques herein reduce thermal budgets and/or process times by increasing or expanding the reactivity of the vapor or liquid chemistry used in a cleaning process. Processes can include sequential removal of a polymer film followed by removal of a metal hard mask.

Processes herein also enable reduced processing temperatures. Thermal budget can be an important parameter. This is because temperature loss on a spinning substrate is significant as substrate sizes expand. For example, de-ionized water (DIW) dispensed at 65 degrees Celsius can cool to 59 degree at 150 mm from the center as in the case of 300 mm wafer, and can cool to 54 degrees at 225 mm from the center of the substrate as in the case of 450 mm wafer. In this particular example, spin speed was 1000 rpm with air temperature at 23 C. Temperature loss is also a concern because it leads to non-uniform cleaning or etching from center to edge of the spinning substrate. Techniques herein, however, provide an extension of recycled chemistry lifetime. Chemistries containing chemical species that decompose as a function of time can be used longer at lower temperatures. Examples of a recycled chemistry is SC1 (NH4OH:H2O2:DIW), dilute hydrogen peroxide, and SOM (sulfuric ozone mixture). Independent control of the oxidizing and/or reducing nature of the process vapor or fluid on the wafer surface. Oxidizing environments can modify organic materials and assist removal of metal species (metals and/or metal nitrides, carbides, oxides). Reducing environments can modify organic materials and assist by preventing oxidation of exposed metals or reduce exposed metal oxides to their pure metal state).

These techniques significantly enhance etching performance of the hydrogen peroxide without changes to the liquid chemistry itself. The etch rate of the TiN can be controlled by turning on or off the UV illumination or by varying UV intensity. Intensity can also be varied radially relative to the substrate. For example, a given film solution can be thicker toward a center of the substrate as compared to an edge of the substrate (where rotational speeds are higher). UV intensity can then be configured to be greater at the center of the substrate to help UV rays penetrate through the film thickness to reach hydrogen peroxide molecules on the surface of the substrate. When UV radiation strikes hydrogen peroxide, hydrogen peroxide can be broken down into highly reactive forms of oxygen species [, e.g., OH., HO2.,]. With the highly reactive oxygen species in contact with the metal hardmask, removal of the metal hardmask is accelerated. One challenge, however, is that the highly reactive oxygen species exist for an extremely short time—on the order of milliseconds. Thus, if the solution film is relatively thick, then (depending on the intensity of UV radiation) only hydrogen peroxide molecules within an upper portion of the film would be broken down. The highly reactive species are then too far from the surface of the substrate to accelerate etching. With a thinner film solution and/or higher intensity of UV radiation, highly reactive oxygen species can be created at a surface of the substrate and accelerate etching.

Dispense rate can be important and embodiments can use a Low Film Thickness (LFT) dispense procedure. Thin liquid films are obtained by using a low flow rate and the flow of chemistry is periodically cycled on and off. By way of a non-limiting example, at 1000 revolutions per minute, a cycle of 3 seconds off and 1 second on can be used. For a 300 mm or 450 mm wafer a number of dispense positions from center to edge can be used to ensure an average low film thickness across the wafer—preferably less than or equal to 20 micron film thickness. To obtain film thicknesses less than 200 or 20 microns, cycling the solution flow on and off can greatly assist. With a single nozzle center dispense nozzle, cyclically shutting off solution dispense flow can help thickness of the film in the center flatten to less than 20 microns.

Accordingly, techniques herein can improve efficiency in both time and amount of materials used. For single-pass systems there is a savings in time and materials. For recirculating systems there is at least a savings in time.

Existing hardware systems for wet cleaning can be used to implement the methods herein, with the addition of a UV light source. Thus, a system can include a substrate holder having a rotation mechanism, an enclosure to catch fluid that spins off of the substrate, and a nozzle or nozzle array positioned above the substrate. The nozzle can be constructed as an atomizer. Also positioned above is a UV radiation source or reflector/conduit that directs radiation—from a remote UV source—to the substrate surface. In an alternative embodiment, a scanning nozzle, beam or multitude of beams irradiates a portion of a substrate at any one time. Substrate and beam can be in motion, or the substrate can be stationary while a beam moves/scans the wafer, or a beam (UV source) can be fixed and the substrate is in motion. The UV radiation source can be a single source/bulb, or an array of light sources.

Embodiments can include any of a number of UV sources. These can be lamps, diode arrays, and so forth. Selection of a particular UV light source can be determined by the wavelength of light required for a particular cleaning application and/or an intensity and mode of delivery (whole wafer radiation or linear scan). Examples of UV light source are: Hg or Amalgam (Hg/Ag/Sn/Cu) lamps, low pressure, medium pressure, and high pressure. Below shows an example of emission spectra from LP Amalgam lamp. Difference between ozone-free and ozone generating is the selection of glass used for the bulb.

Various lamps are available for use. For selection of excimer lamps, options include: 172 nm, 190 nm, 222 nm, 248 nm, 282 nm, 308 nm. For laser-based UV irradiation, the light source can be scanned across the substrate or use a beam expander to increase exposure area on the substrate surface or a multitude of expanded beams. Laser options include 157 nm, 193 nm (ARF), 248 nm, 308 nm, 351 nm, 9.4 um-10.8 um (CO2 laser). ARC and Flash lamp selections (continuous wave or pulsed) can include Xenon and Krypton. Vacuum UV Lamps can be used such as deuterium lamps that emit between 115 nm and 400 nm depending on a window.

By enabling productive etch rates of hardmasks and at lower temperatures, the lifetime of the etching chemistry can be enhanced and the cost of each cleaning process can be reduced. In a conventional cleaning tool, the TiN etching/stripping chemistry is typically reused within the wafer processing tool for many passes over the wafer.

These and other techniques are useful as a method for metal oxide reduction and organic residue removal. This includes removal of polymer material from metal oxides, such as for back-end-of-line post-etch via cleans, and copper and copper oxide surfaces that are exposed on the substrate.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for cleaning a substrate, the method comprising:
receiving a substrate in a cleaning system, the cleaning system including a wet clean system, a processing chamber, and a fluid delivery sub system, the substrate including a hardmask layer deposited on an underlying layer, and a polymer film at least partially covering the hardtmask layer and exposed portion of the underlying layer;
irradiating a process gas mixture with ultraviolet radiation such that reactive oxygen species are formed;
exposing the substrate to the process gas mixture having reactive oxygen species to produce a modified polymer film;
spinning the substrate on a substrate holder in the processing chamber; and
depositing a hydrogen peroxide-containing liquid mixture on the substrate while the substrate is spinning to remove the modified polymer film.

2. The method of claim 1, wherein exposing the substrate to the process gas mixture includes flowing the process gas mixture across a surface of the substrate.

3. The method of claim 2, wherein exposing the substrate to the process gas mixture having reactive oxygen species causes a chemical modification to the polymer film.

4. The method of claim 1, wherein irradiating the process gas mixture includes the ultraviolet radiation having a wavelength between approximately 180-400 nanometers.

5. The method of claim 1, wherein the process gas mixture includes oxygen or water vapor.

6. The method of claim 1, wherein irradiating the process gas mixture includes providing a light intensity greater than approximately 4 mW/cm2.

7. The method of claim 1, wherein irradiating the process gas mixture includes filtering out UV radiation below 230 nanometers.

8. The method of claim 1, wherein depositing the hydrogen peroxide-containing liquid mixture on the substrate comprises the hydrogen peroxide solution including a solvent that dissolves the polymer film.

9. The method of claim 1, further comprising irradiating the hydrogen peroxide-containing liquid mixture on the substrate with ultraviolet radiation while the substrate is spinning, the ultraviolet radiation having a wavelength between approximately 185-400 nanometers.

10. The method of claim 9, wherein irradiating includes the ultraviolet radiation having approximately 185 nanometer wavelengths and 254 nanometer wavelengths.

11. The method of claim 10, wherein irradiating includes providing a light intensity greater than approximately 4 mW/cm2.

12. The method of claim 11, wherein irradiating the process gas mixture includes filtering out UV radiation below 230 nanometers.

13. The method of claim 1, wherein spinning the substrate includes spinning the substrate at a rotational velocity sufficient to cause the deposited hydrogen peroxide-containing liquid mixture to have a film thickness of less than approximately 200 microns.

14. The method of claim 1, wherein irradiating the hydrogen peroxide solution includes irradiating the ultraviolet radiation with an intensity per unit area sufficient to increase a hardmask strip rate by more than approximately 25% as compared to a strip rate of the hardmask without irradiation.

15. The method of claim 1, further comprising, maintaining a process temperature within the processing chamber that is less than approximately 50 degrees Celsius.

16. A method for cleaning a substrate, the method comprising:
receiving a substrate in a cleaning system, the cleaning system including a wet clean system, a processing chamber, and a fluid delivery sub system, the substrate including a hardmask layer deposited on an underlying layer, and a polymer film at least partially covering the hardtmask layer;
irradiating a process gas mixture with ultraviolet radiation such that reactive oxygen species are formed;
exposing the substrate to the process gas mixture having reactive oxygen species to produce a modified polymer film;
spinning the substrate on a substrate holder in the processing chamber; and
depositing a peroxygen compound-containing liquid mixture on the substrate to remove the modified polymer film.

17. The method of claim 16, wherein depositing the peroxygen compound-containing liquid mixture on the substrate includes the peroxygen compound-containing liquid mixture comprising a solvent that dissolves the polymer film.

18. The method of claim 16, further comprising irradiating the peroxygen compound-containing liquid mixture on the substrate with ultraviolet radiation while the substrate is spinning, the ultraviolet radiation having approximately 185 nanometer wavelengths and 254 nanometer wavelengths.

19. A method for cleaning a substrate, the method comprising:
providing substrate including a hardmask layer deposited on an underlying layer, and a polymer film at least partially covering the hardmask layer;
irradiating a process gas mixture with ultraviolet radiation such that reactive oxygen species are formed;
exposing the substrate to the process gas mixture having reactive oxygen species to produce a modified polymer film;
spinning the substrate on a substrate holder in the processing chamber; and
depositing a hydrogen peroxide-containing liquid mixture on the substrate while the substrate is spinning to remove the modified polymer film.

20. The method of claim 19, wherein the process gas mixture includes a first mixture of gases and a second mixture of gases, the first mixture of gases comprising an oxidizing gas chemistry, and the second mixture of gases comprising a reducing gas chemistry, wherein the first process gas mixture includes an oxidizing gas, wherein the second mixture of gases includes hydrogen, and wherein the oxidizing gas is irradiated and exposed to the substrate prior to irradiating the reducing gas and exposing the reducing gas to the substrate.

* * * * *

UNITED STATES PATENT AND TRADEMARK OFFICE
CERTIFICATE OF CORRECTION

PATENT NO. : 10,347,503 B2
APPLICATION NO. : 14/537702
DATED : July 9, 2019
INVENTOR(S) : Ian J. Brown et al.

Page 1 of 1

It is certified that error appears in the above-identified patent and that said Letters Patent is hereby corrected as shown below:

In the Claims

In Column 13, Line 50, Claim 1, delete "hardtmask" and insert -- hardmask --.

Signed and Sealed this
Fourteenth Day of January, 2020

Andrei Iancu
*Director of the United States Patent and Trademark Office*